United States Patent
Ogimoto

(10) Patent No.: US 8,932,699 B2
(45) Date of Patent: *Jan. 13, 2015

(54) CRYSTALLINE SUBSTANCE, SUBSTRATE, AND METHOD FOR PRODUCING CRYSTALLINE SUBSTANCE

(75) Inventor: Yasushi Ogimoto, Higashiyamato (JP)

(73) Assignee: Fuji Electric Co., Ltd. (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/002,587

(22) PCT Filed: Mar. 2, 2012

(86) PCT No.: PCT/JP2012/055343
§ 371 (c)(1),
(2), (4) Date: Aug. 30, 2013

(87) PCT Pub. No.: WO2012/124507
PCT Pub. Date: Sep. 20, 2012

(65) Prior Publication Data
US 2013/0337228 A1    Dec. 19, 2013

(30) Foreign Application Priority Data
Mar. 14, 2011  (JP) .................. 2011-055007

(51) Int. Cl.
C30B 1/04       (2006.01)
C30B 29/32      (2006.01)
B82Y 30/00      (2011.01)
C30B 33/02      (2006.01)
H01L 21/02      (2006.01)

(52) U.S. Cl.
CPC .............. *C30B 1/04* (2013.01); *C04B 2235/768* (2013.01); *H01L 21/02197* (2013.01); *C01P 2002/34* (2013.01); *B82Y 30/00* (2013.01); *C30B 29/32* (2013.01); *C30B 33/02* (2013.01)
USPC ................................. 428/141; 117/7

(58) Field of Classification Search
None
See application file for complete search history.

(56) References Cited

U.S. PATENT DOCUMENTS

| 5,855,668 A | 1/1999 | Kawasaki et al. |
| 2001/0013311 A1* | 8/2001 | Migita et al. ............ 117/1 |
| 2008/0217622 A1* | 9/2008 | Goyal .................... 257/64 |

FOREIGN PATENT DOCUMENTS

| JP | 07-267800 A | 10/1995 |
| JP | 2000-086400 A | 3/2000 |
| JP | 2000-159600 A | 6/2000 |
| JP | 2006-069820 A | 3/2006 |

OTHER PUBLICATIONS

ISR issued Jun. 12, 2012 for PCT/JP2012/055343.
Kawasaki, et al., "Atomic Control of the SrTiO3 Crystal Surface", Science, vol. 266, Dec. 2, 1994, pp. 1540-1542.

* cited by examiner

*Primary Examiner* — David Sample
(74) *Attorney, Agent, or Firm* — Rossi, Kimms & McDowell LLP

(57) ABSTRACT

The present invention provides a crystalline substance that has an uneven structure extending along the direction of a crystal axis. An aspect of the present invention provides a crystalline substance 1, which has a surface 10L that exposes an oxide crystal thereon and extends in a direction of a crystal axis of the oxide crystal, wherein the surface 10L has an uneven structure that is configured by faces 11L to 14L extending in at least three orientations along the crystal axis.

3 Claims, 8 Drawing Sheets

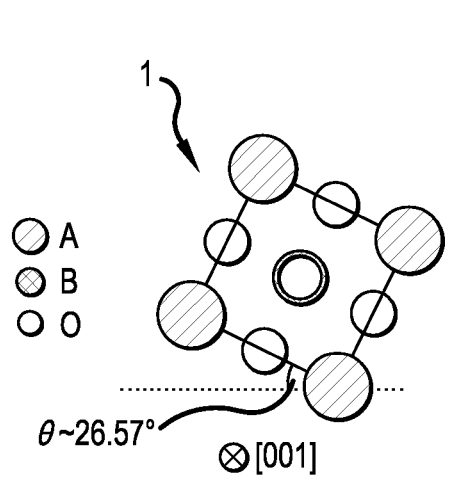
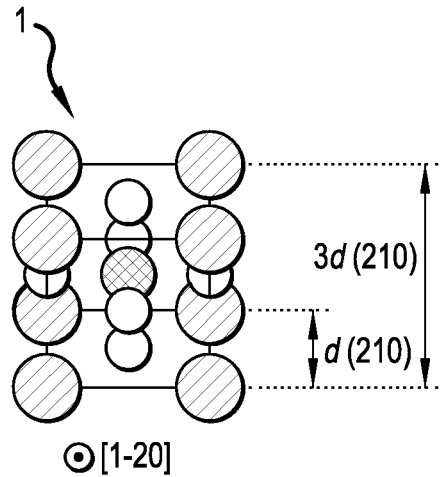
FIG.1(a)  FIG.1(b)
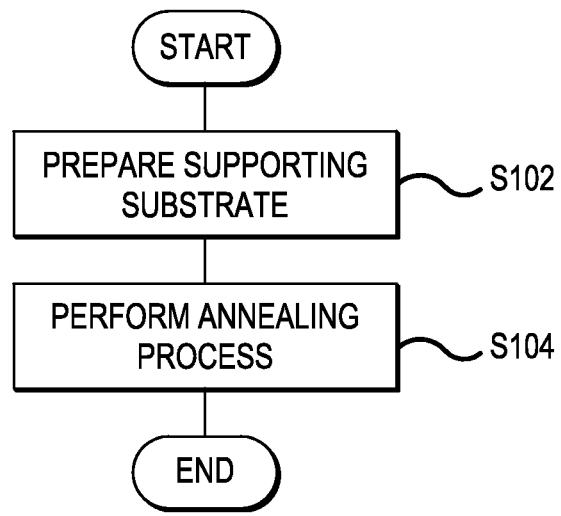
FIG.2

US 8,932,699 B2

CRYSTALLINE SUBSTANCE, SUBSTRATE, AND METHOD FOR PRODUCING CRYSTALLINE SUBSTANCE

This application is a U.S. National Phase Application of PCT International Application PCT/JP2012/055343 filed on Mar. 2, 2012 which is based on and claims priority from JP 2011-055007 filed on Mar. 14, 2011, the contents of which are incorporated in their entirety by reference.

TECHNICAL FIELD

The present invention relates to a crystalline substance, a substrate, and a method for producing the crystalline substance. More specifically, the present invention relates to a crystalline substance having an uneven surface structure with an oxide crystal, a substrate, and a method for producing the crystalline substance.

BACKGROUND ART

Recently, quantum structures such as quantum dots and quantum wires (referred to as "nanostructure" hereinafter) have vigorously been studied for the purpose of exhibiting new functions or upgrading the existing capabilities in a device that cannot be in a bulk form. One of the known structures used for forming these nanostructures is called "step-and-terrace structure formed on the surface of the single crystalline substrates. The terraces of the step-and-terrace structure configure flat faces at the level of an atomic layer, whereas the steps each configure a height difference equal to the size of a unit cell of a substrate material, or integer multiple or half-integer multiple of the unit cell size. The step-and-terrace structure, therefore, is used for the purpose of forming such nanostructure that repeats regularly or cyclically. There has been studied a method for using, for example, a sputtering method, a laser ablation method, and an MBE method to regularly or cyclically dispose a plurality of materials, starting from the boundary (step edge) between the step and the terrace, in order to create a one-dimensional quantum wire (nanowire).

As a method for creating the step-and-terrace structure onto an oxide crystal, there is known a method of combining an annealing step performed in the atmosphere at approximately 1000° C. and a wet etching step using acid. For instance, it has been reported that a step-and-terrace structure that has a $TiO_2$ terminated terrace face can be obtained by etching a surface of a strontium titanate ($SrTiO_3$) (100) plane oriented single-crystal substrate with BHF (buffered hydrofluoric acid) (Non-patent Document 1).

Patent Document 1 (Japanese Patent Application Publication No. 2000-159600) discloses producing a step-and-terrace structure on a strontium titanate substrate by cutting its surface in a face orientation inclined from a (100)-plane, so that the formed steps extend in the direction of a [001] axis (paragraph [0018] in Patent Document 1). Patent Document 1 also discloses that the levels of the steps of the step-and-terrace structure change depending on the time required for a thermal treatment (paragraphs [0019] and [0020] in Patent Document 1).

Patent Document 1: Japanese Patent Application Publication No. 2000-159600 (e.g., paragraphs [0018] to [0020])

Non-patent Document 1: M. Kawasaki et al., "Atomic control of the $SrTiO_3$ crystal surface," Science vol. 266, pp. 1540-1542 (1994)

DISCLOSURE OF THE INVENTION

The mechanism of forming a step-and-terrace structure using the conventional method described in Non-patent Document 1 relates to a miscut angle, which is an angle error remaining between a target plane orientation for creating the structure and an actual surface in an actual crystal substrate. Thus, an in-plane direction of the step-and-terrace structure has nothing to do with the direction of a crystal axis of the crystal substrate. Note that the miscut angle is usually 0.3 to 0.5 degrees.

Even when such a step-and-terrace structure is formed to have an orientation unrelated to the crystal axis of the substrate due to the miscut angle, a nanostructure to be formed therein cannot be used for the purpose of controlling the functions of a corresponding device. This is because the conductance or electronic properties for magnetization used in the device generally reflect the anisotropy of the crystal itself, and the same is true for an oxide. In other words, even if the miscut angle is used to form a nanostructure that reflects the shape-related anisotropy of the step-and-terrace structure, the anisotropy based on a quantum effect of the shape of the nanostructure and the original anisotropy based on the crystal become unrelated to each other. In other words, the anisotropy based on a quantum effect and the original anisotropy might cancel each other out due to the miscut angle or might facilitate each other. For these reasons, the quantum effect-related functions of a device that uses the conventional step-and-terrace structure having miscut angles cannot be exhibited as intended or are affected by production batches of the substrates.

Hence, the method disclosed in Patent Document 1 (Japanese Patent Application Publication No. 2000-159600) potentially eliminates the uncertainty generated between the shape of the step-and-terrace structure and the crystal axis, because the step-and-terrace structure extends in the direction of the [001] axis of the substrate surface. However, the shape disclosed in Patent Document 1 is limited to the conventional step-and-terrace structure. In other words, as with the conventional step-and-terrace structure, the shape of the surface disclosed in Patent Document 1 has step portions and terrace portions arranged alternately in one direction, wherein each of the step portions configures a face in one orientation, and each of the terrace portions configures a face in one orientation. Therefore, this structure has two types of faces. It is, therefore, not easy to exhibit one-dimensional characteristics of a quantum wire by using this step-and-terrace structure.

The step-and-terrace structure is further described in more detail based on the disclosure of Patent Document 1. First, a method for intentionally tilting the (100) face at a small angle (off-angle) is employed. In Patent Document 1, this off-angle is described as, for example, 2 degrees, 5.7 degrees, or 6 degrees (paragraphs [0017] to [0020] of Patent Document 1). When the off-angle is 2 degrees, the BHF-etched substrate is subjected to a thermal treatment in oxygen at 900° C., whereby a height difference corresponding to an average step height of a substantially three-unit crystal lattice layer is realized. Similarly, when the off-angle is 6 degrees, the substrate is subjected to a thermal treatment in oxygen at 900° C. for one hour, whereby the step height becomes substantially equivalent to a three- to five-unit crystal lattice layer. When the off-angle is 5.7 degrees, the substrate is subjected to a thermal treatment in oxygen at 900° C. for two hours, whereby the step height becomes substantially equivalent to an average of six-unit crystal lattice layer. The shape of thus formed step-and-terrace structure is a normal structure extending in one direction of the substrate surface, which is, in other words, a structure having a total of two faces: one face for the step portions and one for the terrace portions (FIG. 4(c) of Patent Document 1).

The inventor of the present application made an attempt to set the off-angle at an angle greater than that described in Patent Document 1, to increase the height difference of the step-and-terrace structure. In so doing, the inventor first examined the state of an approximately 45-degree off-angle, which is considered the largest possible off-angle. FIG. 9 is a schematic diagram showing a cross-sectional relationship between a crystalline substance having an off-angle of approximately 45 degrees, and a surface thereof. FIG. 9(a) shows the off-angle that geometrically is exactly 45 degrees. Even in the case where a (110) plane is adopted in the actual substrate, steps of miscut angles are inevitable due to the limit of production accuracy. FIG. 9(b) illustrates the case where a miscut angle overlaps with the 45-degree off-angle, the miscut angle being a residual error generated during the production. FIG. 9 omits illustration of a crystal lattice connecting the lattice points of cubic basic unit lattices. The surface of the crystalline substance extends in the lateral direction in the page space of FIG. 9.

However, in the crystalline substance with the 45-degree off-angles, the (110) plane configures a stable surface and terminates the surface of the substrate as shown in FIG. 9(a). Even when steps are to be formed, these steps would be based on the miscut angle, as shown in FIG. 9(b). The orientation of the actual miscut angle cannot specified, as with the conventional miscut angle described above. Therefore, when attempting to increase the off-angle, the structure extending in the direction of the [001] axis cannot be created. Even when steps extending in a certain direction such as the direction of the [001] axis are obtained as a result of the attempt, the height difference realized by these steps remains at approximately unit cell size×($\frac{1}{2}$)$^{1/2}$, or approximately 0.28 nm in the case of SrTiO$_3$, as shown in FIG. 9(b).

The present invention was contrived in view of the problems described above. An object of the present invention is to provide a crystalline substance having an uneven structure, a substrate having the crystalline substance, and a method for producing the crystalline substance, the uneven structure being clearly associated with a direction of a crystal axis and extending in the direction. Accordingly, the present invention can contribute to development of various devices that utilize the electronic properties realized by the uneven structure.

The inventor of the present application has discovered a new phenomenon in which an uneven structure with a height difference greater than that of the conventional step-and-terrace structure is formed. The inventor has then discovered that the structure of the surface of the resultant crystalline substance is effective for achieving the object described above.

In other words, a certain aspect of the present invention provides a crystalline substance, which has a surface that exposes an oxide crystal thereon and extends in a direction of a crystal axis of the oxide crystal, wherein the surface has an uneven structure that is configured by faces extending in at least three orientations along the crystal axis.

A certain aspect of the present invention also provides a crystal substrate having the crystalline substance of the aspect described above.

Another aspect of the present invention provides a method for producing a crystalline substance that has an uneven structure on a surface thereof, the method having a step of preparing a crystalline substance that has a surface exposing an oxide crystal thereon and extending in a direction of a crystal axis of the oxide crystal, and a step of forming an uneven structure that is configured by faces extending in at least three orientations along the direction of the crystal axis, by annealing the surface.

According to the individual aspects described above, the uneven structure includes the faces that extend in at least three orientations along the direction of the crystal axis. At least three orientations here are specified by the normal vectors of the individual faces. By specifying the normal vectors for local faces respectively, at least three types of normal vectors are obtained. The orientations that coincide by being inverted 180 degrees, in other words, the orientations antiparallel to each other, are defined as different orientations. In addition, regarding the orientations of the faces, even two planes defining the faces are parallel to each other, the faces are considered to be disposed in orientations different from each other as long as they are inverted. Specifically, in the present application, different "orientations" are considered to be specified by "inversion", whereas a "direction" and a "direction" that is obtained by "inversion" of the former direction are considered to be the same.

According to each of the aspects, the crystalline substance is any object, at least a part of which configures a crystal. The best example of the crystalline substance described in each aspect is a single-crystal object. Examples of the crystalline substance described in each aspect also includes a crystalline object that includes various lattice defects, a polycrystalline or microcrystalline object that is partitioned by grain boundaries, the size of which is coarser than the characteristic size for defining the performance of physical properties in relation to the material used therein. The crystalline substance is not limited to a material of a single composition. Examples of the oxide crystal described in each aspect include metallic oxides with a cubic perovskite structure and other compound crystals that have compositions containing oxygen, the compositions not being limited.

The crystal axis described in each aspect is a [001] axis in, for example, a cubic perovskite structure, which is an axis including any of three basic vectors that subtend the unit cells of the crystal. A face extending in the direction of the crystal axis means that the face defining the extensity includes a directional axis parallel to the crystal axis. However, inconsistency of the faces relating to an angle error caused for various reasons during the implementation of the present invention is permitted.

In each of the aspects, annealing of the crystalline substance generally means a process of heating the crystalline substance at a controlled temperature for a certain period of time. Even a process that is performed for a purpose other than heating is included in the annealing process described in each aspect, as long as it increases the temperature of the crystalline substance for a certain period of time. Examples of the annealing process include a process of heating the crystalline substance in order to form a layer made of a material same as or different from the material of the crystalline substance, and a process of improving the surface of the crystalline substance by heating it under a certain atmosphere (e.g., in the air or in an oxide atmosphere).

These aspects of the present invention can provide an uneven structure in an oxide crystal, the uneven structure having a height difference greater than the height difference of a step-and-terrace structure. The crystalline substance, the substrate, and the method for producing the crystalline substance according to any of the aspects of the present invention can utilize the crystal axis-related anisotropy unique to the material of the crystalline substance and the anisotropy associated with the shape of the surface of the crystalline substance.

BRIEF DESCRIPTION OF THE DRAWINGS

FIG. 1 is a schematic cross-sectional diagram showing unit cells of a (210)-plane oriented oxide crystalline substance according to an embodiment of the present invention, FIG. 1(a) being a side view showing the unit cells facing an in-plane [001] axis, and FIG. 1(b) a side view showing the back of the unit cells facing an in-plane [1-20] axis;

FIG. 2 is a flowchart showing a method for producing a crystalline substance according to an embodiment of the present invention;

BEST MODE FOR CARRYING OUT THE INVENTION

Figure 3:
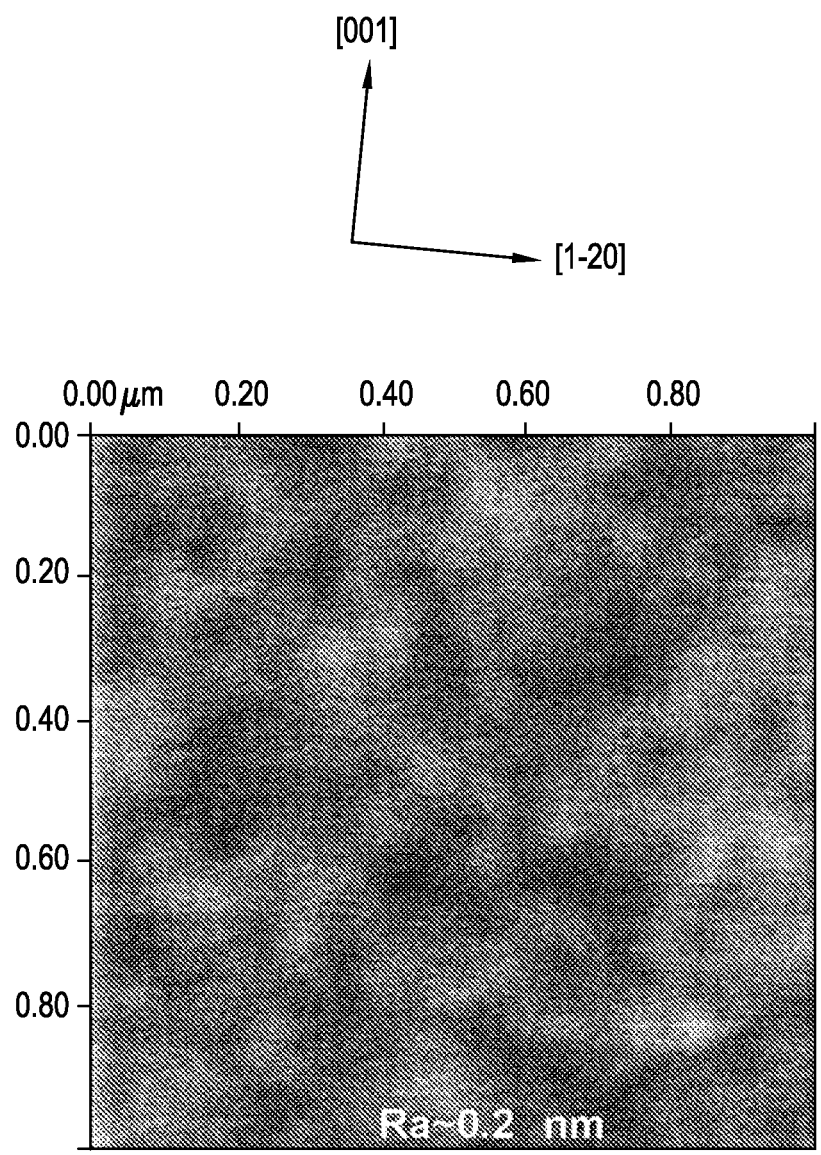
FIG. 3 shows an AFM image of a surface of a commercially available SrTiO₃ (210) single-crystal substrate.

Embodiments of a crystalline substance, a substrate, and a method for producing the crystalline substance according to the present invention are now described hereinafter. Unless otherwise specifically stated in the following description, common reference numerals are used to designate common parts or elements throughout the drawings. The scale ratios of the elements described in each of the embodiments are not necessarily the same.

First Embodiment

The present embodiment describes a crystalline substance which is obtained by forming an uneven structure on a surface of a strontium titanate (SrTiO₃) (210)-plane orientated single crystal plate having a cubic perovskite structure. A crystalline substance to be produced is referred hereinafter as "crystalline substance 1."

[Crystal Orientation]

First of all, FIG. 1 is referred to describe unit cells of a SrTiO₃ (210)-plane orientated single crystal which has a cubic perovskite structure employed in the crystalline substance 1 of the present embodiment. FIG. 1 is a schematic cross-sectional diagram showing the unit cells of a (210)-plane orientated oxide crystalline substance, which has a cubic perovskite structure. For example, SrTiO₃ used in the crystalline substance 1 has a cubic perovskite structure. Since a cubic perovskite structure is taken even when the crystalline substance 1 is of a different material, the cubic perovskite structure is so described as not to lose its generality.

A cubic perovskite structure is generally designated as "ABO₃," wherein A is the apex, B the body-centered, and O (oxygen) occupies at each face-centered position in a cubit unit cell. In the present embodiment, the apex is described as "A site" and an atom occupying the apex as "A atom." An atom occupying the body-centered, B site, is similarly described as "B atom." In SrTiO₃, Sr is an A atom and Ti a B atom.

FIG. 1 illustrates a cross section of a surface of the crystalline substance in a lateral direction. As shown in FIG. 1, a (210) plane along directions of a [1-20] axis and [001] axis of a crystal lattice is positioned along a direction in which the surface of the crystalline substance extends. The [1-20] axis and the [001] axis are described as "in-plane [1-20] axis" and "in-plane [001] axis," respectively, in order to indicate that these axes exist in-plane of the surface of the crystalline substance. FIG. 1 shows that a [210] axis extends vertically toward the page space. The direction of this [210] axis is referred to as "surface-perpendicular direction" as it is a normal direction of the direction in which the surface of the crystalline substance extends. FIG. 1(a) is a side view of the unit cells facing the in-plane [001] axis, and FIG. 1(b) a side view of the back of the unit cells facing the in-plane [1-20] axis.

The angle formed by the surface of the crystalline substance and a (100) plane, which is the angle θ formed by the (210) plane and the (100) plane, is approximately 26.56 degrees. In the crystalline substance 1, atomic planes AO-BO₂ are alternately stacked on one another in the surface-perpendicular direction. In the crystalline substance 1, the spacing between the atomic planes on the (210) plane in the surface-perpendicular direction is obtained by the following formula:

$$d(210) = a \cdot \sin \theta \quad \text{Formula 1.}$$

In the case where the crystalline substance 1 is SrTiO₂, the value of the d(210) is obtained as 0.1746 nm as a result of substituting a value of approximately 0.3905 nm to the term a and substituting a value of approximately 26.56 degrees to the term θ. If the cubic crystal unit cells tilt 26.56 degrees from the (100) plane, the spacing therebetween in the surface-perpendicular direction becomes 3d(210)=0.5238 nm. FIG. 1(b) illustrates the spacing expressed by the d(210) and 3d(210). Further, the length of the surface-perpendicular direction is 5d(210)=0.873 nm in view of the periodicity of the in-plane atomic positions.

Comparative Example

States of the Surface after Annealing Process is Performed

As described in connection with Non-patent Document 1, conventionally, a step-and-terrace structure with miscut angles is formed on a crystal by performing an annealing process on its oxide surface in the atmosphere at approximately 1000° C. and a wet etching process using acid. Two samples of the crystalline substance were analyzed to see how the surfaces thereof would change as a result of annealing processes. Specifically, the first comparative sample is made of SrTiO₃, the same material as the crystalline substance 1, and has a (100) face orientation, different from the one shown in FIG. 1. The second comparative sample is made of $(LaAlO_3)_{0.3}$—$(SrAl_{0.5}Ta_{0.5}O_3)_{0.7}$ (designated as "LSAT" hereinafter) unlike the crystalline substance 1, and has a (210) face orientation as with the crystalline substance 1.

(First Comparative Sample)

It was confirmed through an AFM (atomic force microscope) that the same, conventional step-and-terrace structure was formed in the first comparative sample of $SrTiO_3$ (100) face-oriented crystalline substance, as a result of performing an annealing process thereon in the atmosphere at the end-point temperatures 1180 to 1200° C. for the crystalline substance for 12 hours. The height difference formed by the presences of the steps was approximately 0.4 nm, equivalent to the size of the unit cells of the $SrTiO_3$, and an angle of approximately 30 degrees was formed by a direction in which the step edges extend on the surface of the crystalline substance and a direction of a crystal axis on the surface of the crystalline substance. In this first comparative sample, the direction of the step edges did not match the direction of the crystal axis. The step-and-terrace structure formed in the first comparative sample had two types of face orientations: the orientation of the faces of the step portions and the orientation of the faces of the terrace portions. The step-and-terrace structure formed in the first comparative sample also had the shape of steps or sawteeth. Furthermore, it was separately confirmed that the above-described direction of the step edges was at an angle of 20 degrees in another batch of $SrTiO_3$ (100)-plane orientated crystalline substances, which was created to obtain the (100)-plane orientation. This means that the direction of the step edges could not be controlled in the case of a $SrTiO_3$ (100)-plane orientated crystalline substance which was created under the same conditions as the first comparative sample.

(Second Comparative Sample)

It was confirmed through the AFM that the conventional step-and-terrace structure was formed in the second comparative sample of LSAT (210)-plane oriented crystalline substance, as a result of performing an annealing process thereon in the atmosphere at the end-point temperature 1100° C. for the crystalline substance for 12 hours. The height difference formed by the presences of the steps was approximately 0.5 to 1 nm, equivalent to or twice the size of unit cells of the LSAT, and an angle of approximately 40 degrees was formed by a direction in which the step edges extend on the surface of the crystalline substance and a direction of a crystal axis on the surface of the crystalline substance. In this first comparative sample, the direction of the step edges did not match the direction of the crystal axis. The step-and-terrace structure formed in the second comparative sample had two types of face orientations: the orientation of the faces of the step portions and the orientation of the faces of the terrace portions. The step-and-terrace structure formed in the second comparative sample also had the shape of steps or sawteeth. Furthermore, it was separately confirmed that the above-described direction of the step edges was at an angle of 10 degrees in another batch of LSAT (210)-plane oriented crystalline substances, which was configured by the same target cutout angles. This means that the direction of the step edges could not be controlled in the case of a LSAT (210)-plane oriented crystalline substance which was created under the same conditions as the second comparative sample.

Example

Formation of Nanostructure in $SrTiO_3$ (210)-Plane Orientated Crystalline Substance The above comparative example indicates that the annealing temperatures required to form the step-and-terrace structures vary depending on the materials of the crystalline substances and the orientations of the cut-out faces of the crystalline substances. Thus, this example of the present embodiment employs the $SrTiO_3$ (210)-plane orientated crystalline substance to produce two samples of crystalline substances, with the annealing temperature set at 1100° C. and 1180° C. The sample of the $SrTiO_3$ (210) crystalline substance 1, which was produced by a 12-hour annealing process at 1100° C., is referred to as "low-temperature sample." Another sample was obtained by performing an additional annealing process on the low-temperature sample of the crystalline substance 1. This sample is referred to as "high-temperature sample."

With the low-temperature sample as an example, a method for producing a crystalline substance according to the present embodiment is described with reference to FIG. 2. FIG. 2 is a flowchart showing the method for producing the crystalline substance according to the present embodiment. First, for the purpose of prior confirmation, a crystalline substance where $SrTiO_3$ is exposed on its surface is prepared as an oxide crystal (S102). A crystalline substance that is commercially available, such as a $SrTiO_3$ single-crystal substrate, can be employed as this crystalline substance. A surface of this crystalline substance is configured as a $SrTiO_3$ (210) face and naturally extends in the direction of a [001] crystal axis. Next, an annealing process is performed (S104). This annealing process is described in detail hereinafter. As a result, an uneven structure is formed on the surface of the crystalline substance, the uneven structure being configured by the faces of at least three orientations that extend along the direction of the [001] crystal axis.

FIG. 3 shows an AFM image of the surface of a commercially available $SrTiO_3$ (210) single-crystal substrate. An AFM image usually has halftone pixels, but the AFM image on the page space shows a halftone at a density of subtle black-and-white pixels. As shown in FIG. 3, the surface of the commercially available $SrTiO_3$ (210) single-crystal substrate is flat to the sub-nm level and has no regular steps or terraces.

Figure 4:
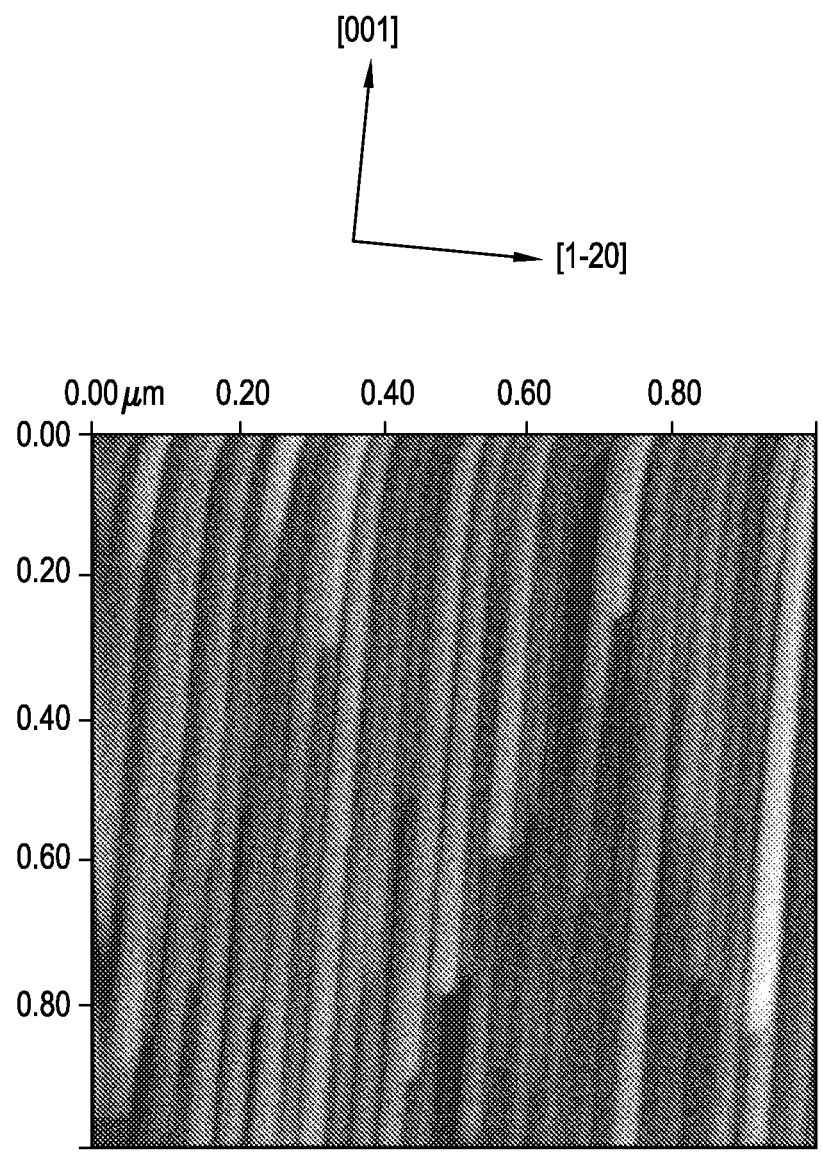
FIG. 4 shows an AFM image of the surface of the SrTiO₃ (210) single-crystal substrate annealed at 1100° C., according to an embodiment of the present invention.
Figure 5:
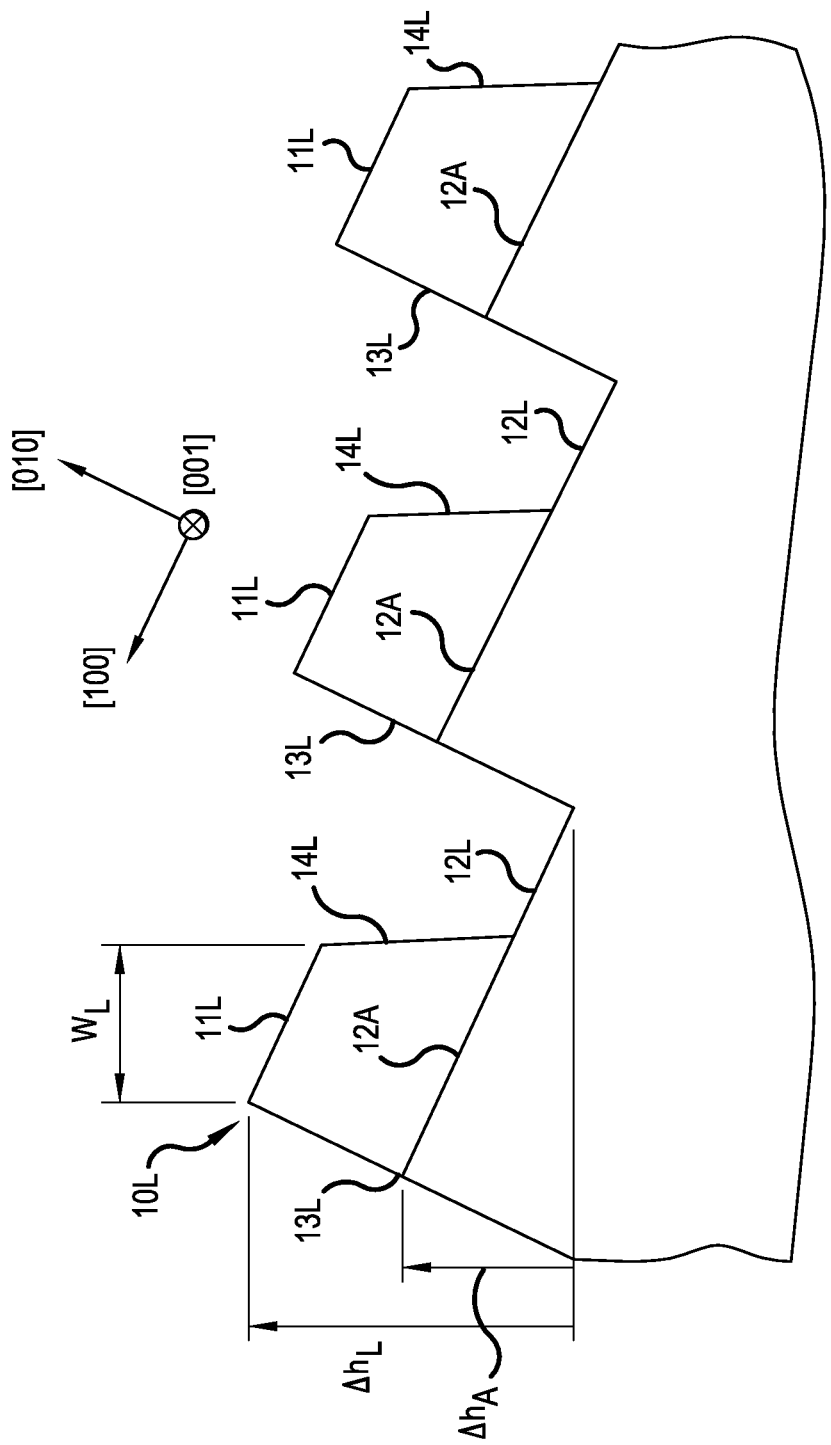
FIG. 5 is a schematic diagram showing the cross-sectional shape of a surface of a low-temperature sample of a crystalline substance according to an embodiment of the present invention, the surface having an uneven structure and taken along a face perpendicular to a direction in which the uneven structure extends.

FIG. 4 shows an AFM image of a surface 10L of the crystalline substance 1 which is produced by annealing the low-temperature sample, the commercially available $SrTiO_3$ (210) single-crystal substrate. As with FIG. 3, FIG. 4 shows a halftone of the AFM image at a density of subtle black-and-white pixels. FIG. 5 is a schematic diagram showing the cross-sectional shape of the surface of the low-temperature sample, the surface having an uneven structure and taken along a face perpendicular to a direction in which the uneven structure extends. It was confirmed that, as shown in FIG. 4, an uneven structure where elongated ridges with a width $W_L$ of approximately 40 nm extend over 1 μm long in the direction of the [001] axis is formed on the surface 10L of the low-temperature sample of the crystalline substance 1 in such a manner as to be parallel to the surface of the $SrTiO_3$ (210) single crystalline substance. As a result of measuring the surface of the low-temperature sample along the direction of the in-plane [1-20] axis, it was confirmed that the surface 10L has an uneven structure with a height difference $\Delta h_L$ of approximately 3 nm, as shown in FIG. 5. Note that the surface 10L has approximately six of these height differences in terms of the unit cells of $SrTiO_3$.

From the AFM image shown in FIG. 4 and the schematic diagram of the uneven structure shown in FIG. 5, the uneven structure formed in the low-temperature sample is configured by two types of faces, a top face 11L configuring the top of each ridge and a floor face 12L configuring the floor of each terrace, and slope faces 13L and 14L formed therebetween as the steps. Of these faces, the top face 11L and the floor face 12L are parallel to each other and to the (100)-plane of the crystal lattice and face the same direction. The present application has only one orientation for the top faces 11L and the floor faces 12L. The slope faces 13L configuring the steps, on the other hand, are parallel to the (010)-plane of the crystal lattice. The state of the surface was measured in order to identify these planes, by combining a RHEED (reflection high-energy electron diffraction) pattern acquired based on the low-temperature sample of the crystalline substance 1, and the AFM image shown in FIG. 4. Specifically, in the RHEED pattern, a characteristic arrowhead-shaped diffraction pattern corresponding to a facet generated by the (100)-plane and the (010)-plane of the crystal lattice was observed at a position on a diffraction pattern screen that is different from a peak generated by the specular component of the surface 10L, the arrowhead-shaped diffraction pattern having an inclined streak on either side (not shown).

FIG. 5 clearly shows a virtual face 12A obtained by extension of each floor face 12L for comparison. The conventional step-and-terrace structure is configured only by two types of faces: the (010)-plane terraces connecting the floor faces 12L and the virtual faces 12A, and partial steps on the lower side of the slope faces 13L. Faces corresponding to the slope faces 14L are not formed. Height difference $\Delta h_A$ in this structure is a value substantially equivalent to, for example, a lattice constant of each unit cell. On the other hand, the uneven structure obtained in the low-temperature sample has an uneven surface in which the ridges and valleys are formed repeatedly by a height difference $\Delta h_L$ of approximately 3 nm which is greater than the height difference $\Delta h_A$ generated by the step-like step-and-terrace structure having two types of face orientations.

The slope faces 14L configuring the steps are illustrated in the schematic diagram of FIG. 5 as inclined faces; however, it was unclear as to what kind of faces the slope faces actually were. All that is certain is that the top faces 11L and floor faces 12L on the sides of the respective slope faces 14L configure discontinuous pairs of faces with a height difference that face the same direction. In other words, each of the slope faces 14L shown in FIG. 5 is formed in such a manner as to rise from the corresponding floor face 12L toward the corresponding top face 11L. Therefore, each slope face 14L has a face disposed at least in one type of orientation (the face may be flat or curved) different from those of the top face 11L, the floor face 12L, and the slope face 13L. Each slope face 14L can be a face oriented in an opposite direction so as to be parallel to the slope face 13L. In this case as well, the orientation of the slope faces 14L is different from that of the slope faces 13L. For these reasons, the uneven structure on the surface 10L of the low-temperature sample includes faces disposed in at least three orientations and extends in the direction of the [001] axis. In other words, the faces of the uneven structure that are disposed in at least three orientations are the top faces 11L and floor faces 12L disposed in a first orientation, the slope faces 13L disposed in a second orientation different from the first orientation, and the slope faces 14L disposed in a third orientation different from the first and second orientations. The top faces 11L, the floor faces 12L, and the slope faces 13L and 14L are disposed in the direction of the [001] axis, the direction in which the uneven structure extends.

The high-temperature sample of the crystalline substance 1 was produced by performing an annealing process on the low-temperature sample of the crystalline substance 1 in the atmosphere at the end-point temperature 1180° C. for the crystalline substance for 12 hours. It was confirmed in the high-temperature sample that the shape of its surface had changed while keeping the schematic configuration of the uneven structure formed in the surface 10L of the low-temperature sample.

Figure 6:
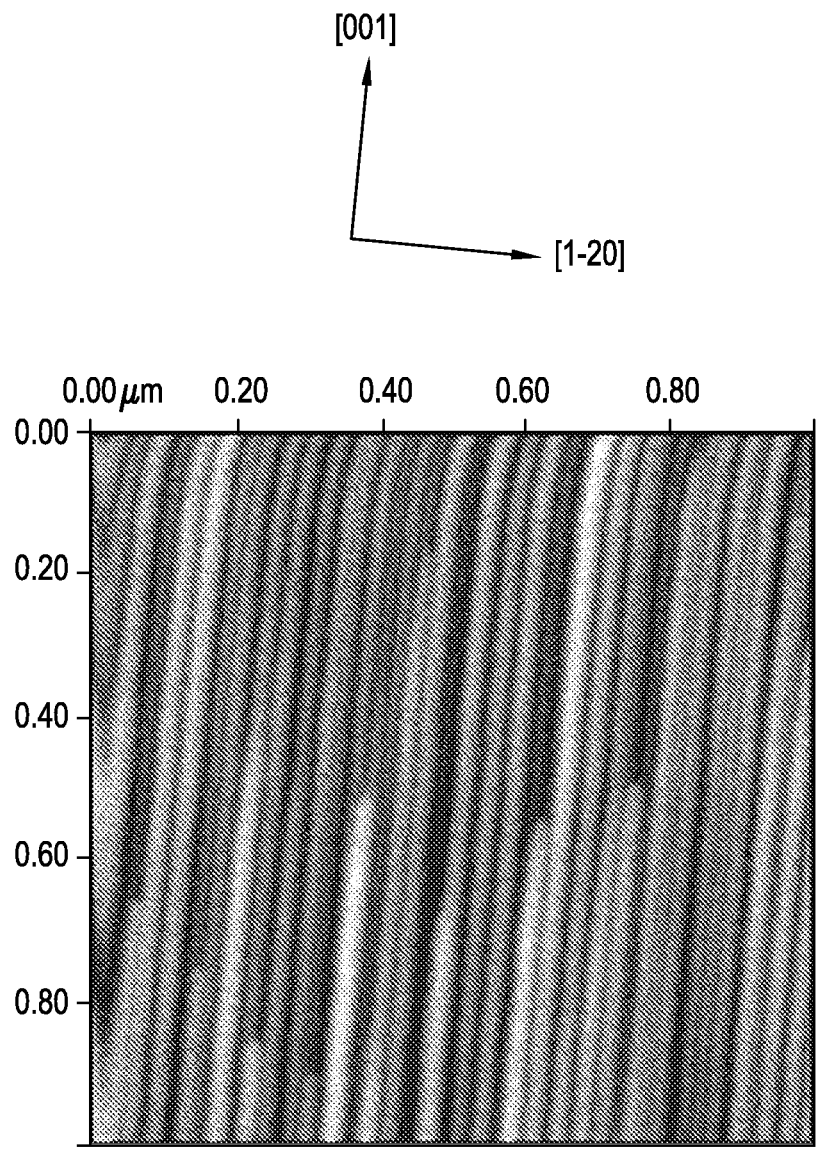
FIG. 6 shows an AFM image of the surface of the SrTiO₃ (210) single-crystal substrate annealed at 1180° C., according to an embodiment of the present invention.
Figure 7:
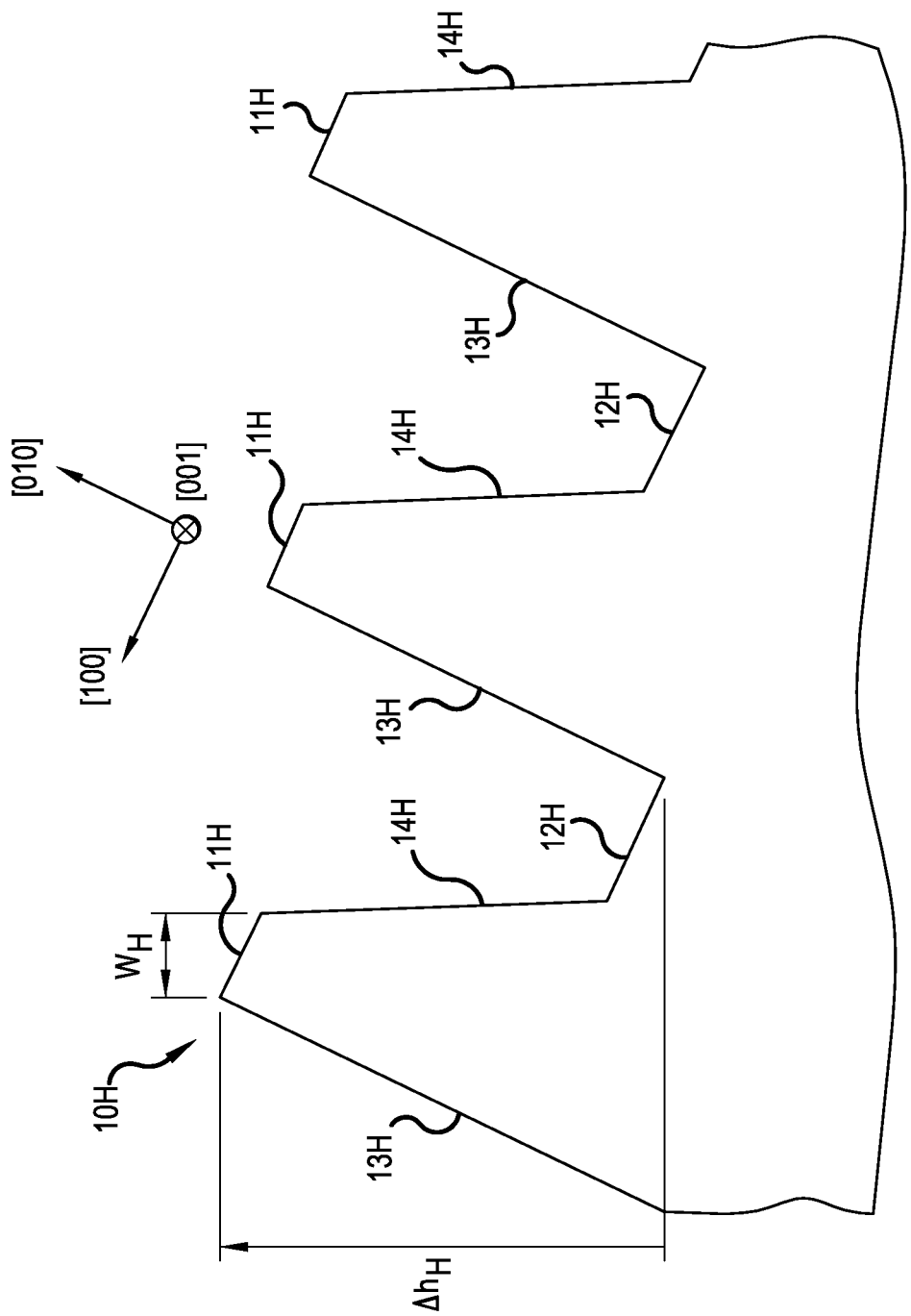
FIG. 7 is a schematic diagram showing the cross-sectional shape of a surface of a high-temperature sample of a crystalline substance according to an embodiment of the present invention, the surface having an uneven structure and taken along a face perpendicular to a direction in which the uneven structure extends.

FIG. 6 shows an AFM image of a surface 10H of the high-temperature sample of the crystalline substance 1. As with FIGS. 3 and 4, the AFM image on the page space of FIG. 6 shows a halftone at a density of subtle black-and-white pixels. FIG. 7 is a schematic diagram showing the surface of the high-temperature sample in the same method as FIG. 5. The surface 10H of the high-temperature sample has an uneven structure where elongated ridges with a width $W_H$ of approximately 20 nm extend over 1 μm long in the direction of the [001] axis. As a result of measuring the height difference in the uneven structure of the surface 10H along the direction of the in-plane [1-20] axis, it was confirmed that a height difference $\Delta h_H$ of approximately 6 nm was generated. Note that the surface 10H has approximately twelve of these height differences in terms of the unit cells of $SrTiO_3$. As with the low-temperature sample of the crystalline substance 1, the high-temperature sample of the crystalline substance 1 also had step edges formed along the direction of the [001] axis. The uneven structure of the surface 10H of the high-temperature sample, too, includes the faces disposed in at least three orientations and extends in the direction of the [001] axis.

As shown in FIG. 7, the surface of the high-temperature sample is substantially in the same uneven shape as the surface of the low-temperature sample shown in FIG. 5. In other words, the uneven structure formed in the high-temperature sample was configured by two types of faces, the top face 11L configuring the top of each ridge and the floor face 12L configuring the floor of each terrace, and the slope faces 13L and 14L formed therebetween as the steps. These faces were disposed in the same orientation. The configuration of each of these faces was determined by combining the AFM image shown in FIG. 6 and a RHEED pattern showing an arrowhead-shaped diffraction pattern corresponding to a facet generated by the (100)-plane and the (010)-plane.

As a result of comparing the low-temperature sample and the high-temperature sample described above, the effects of the temperatures used in the annealing processes were confirmed. Performing the annealing processes at high temperatures reduced the widths of the elongated ridges and increased the height-differences of the uneven structures. It was, therefore, confirmed that the temperatures used in the annealing processes can control the aspect ratio of the widths of the elongated ridges to the height difference of the uneven structures.

[Mechanism of Formation of Uneven Structures]

How the uneven structures are formed in the surfaces 10L and 10H of the crystalline substance 1 (referred collectively as "surface 10" hereinafter) is described based on the experimental results obtained in the comparative example and the example. First, neither of the step-and-terrace structures of the first and second comparative samples is formed along the direction of the crystal axis. In the example, on the other hand, the both samples of the crystalline substance 1 have the uneven structures formed along the crystal axis of the surface 10 of the crystalline substance 1. It is understood that combinations of the materials and face orientations are associated with the conditions for forming an uneven structure in the crystalline substance 1.

Here is described the principle for forming an uneven structure in each of the samples of the crystalline substance of the example in such a manner as to be substantially parallel to the surface of the $SrTiO_3$ (210) crystalline substance, the uneven structure having at least three types of faces extending along the crystal axis. First, several general findings are described. According to the first finding, it is reported, as a result of examining the first comparative sample, which is the $SrTiO_3$ (100)-plane orientated crystalline substance, that Sr or its oxide SrO precipitates on the surface of the crystalline substance due to the annealing process performed thereon in the atmosphere. However, to the best of the inventor's knowledge, there is no record of such precipitation phenomenon in an LSAT (100)-plane orientated crystalline substance. For these reasons, the $SrTiO_3$ crystalline substance and the LSAT crystalline substance have properties different from each other under the thermal equilibrium conditions determined based on oxygen partial pressure and annealing pressure in the atmosphere. In other words, generating a Sr deficiency near the surface of the $SrTiO_3$ crystalline substance and causing the Sr or its oxide to precipitate on the surface under the thermal equilibrium conditions can lead to thermodynamic stability. In the LSAT crystalline substance, on the other hand, not causing such A site deficiency leads to stability in the thermal equilibrium conditions. According to the second finding, a perovskite structure has the lowest energy in the surface of the (100)-plane. In other words, the precipitated Sr or its oxide SrO easily accumulate on the (100)-plane or the (010)-plane equivalent thereto, due to the heat energy applied during the annealing process.

With these findings applied to the surface 10 of the crystalline substance 1, which is the $SrTiO_3$ (210)-plane oriented employed crystalline substance in the example, behaviors of the surface are examined. On the surface of the $SrTiO_3$ (100)-plane oriented crystalline substance and the surface 10 of the crystalline substance 1, Sr or its oxide SrO is considered to similarly precipitate under the same annealing conditions. The faces with prominent accumulation of Sr or SrO due to its precipitation in the crystalline substance 1 are the (100)-plane and the (010)-plane.

Unfortunately, applying these conventional findings to the surface 10 of the crystalline substance 1 is not enough to explain the temperature-related difference thereof shown in FIG. 5. Thus, as a result of examining a mechanism that might be able to explain the actual phenomenon, the difference appears to be due to asymmetry of the $SrTiO_3$ (210)-plane orientated crystalline substance 1, which is caused when Sr or its oxide accumulates on the (100)-plane and the (010)-plane. In other words, because the crystalline substance 1 is asymmetry with respect to the direction of the in-plane [1-20] axis (the lateral direction in the page space of FIG. 1(a)) and has no specular image or inversion symmetry properties, a difference in the growth speed of the surface occurs between the direction of the (100)-plane and the direction of the (010)-plane. Such a difference becomes significant as the growth progresses, generating as many height differences as several unit cells. These height differences eventually become the step edges (step portions) formed along the direction of the [001] axis.

With regard to the initial stage of the growth, whether an end face of the polished surface of the crystalline substance is made of SrO or $TiO_2$ is determined by accident. These components, which are responsible for the formation of a height difference on the polished surface, are caused to migrate through the surface to settle in the stable positions by the heat energy applied by the annealing process. At this moment, accumulation of Sr or SrO on the anisotropically grown surface leads to surface energy stability, resulting in generation of as many height differences as several unit cells. However, excessively great height differences lead to unstable surface energy; thus, an upper limit of the height differences is determined.

Incidentally, the reasons that uneven structures were not formed in the comparative example are as follows. First, in the (100)-plane oriented crystalline substance, which is the first comparative sample of in-plane four-fold symmetry, such anisotropic growth does not occur, hence no formation of a nanostructure along the direction of the crystal axis. The second comparative example of the LSAT (210)-plane oriented crystalline substance does not have a precipitate layer which contributes to the initial stage of the growth, and the (100)-plane or the (010)-plane does not grow anisotropically, resulting in flattening of the surface. Therefore, the inventor believes that adopting the (210) face orientation, or asymmetric off-angles so to speak, is very useful for creating a new uneven structure.

[Specific Method of Annealing Process: Method for Controlling the Shape of Uneven Structure]

Figure 8:
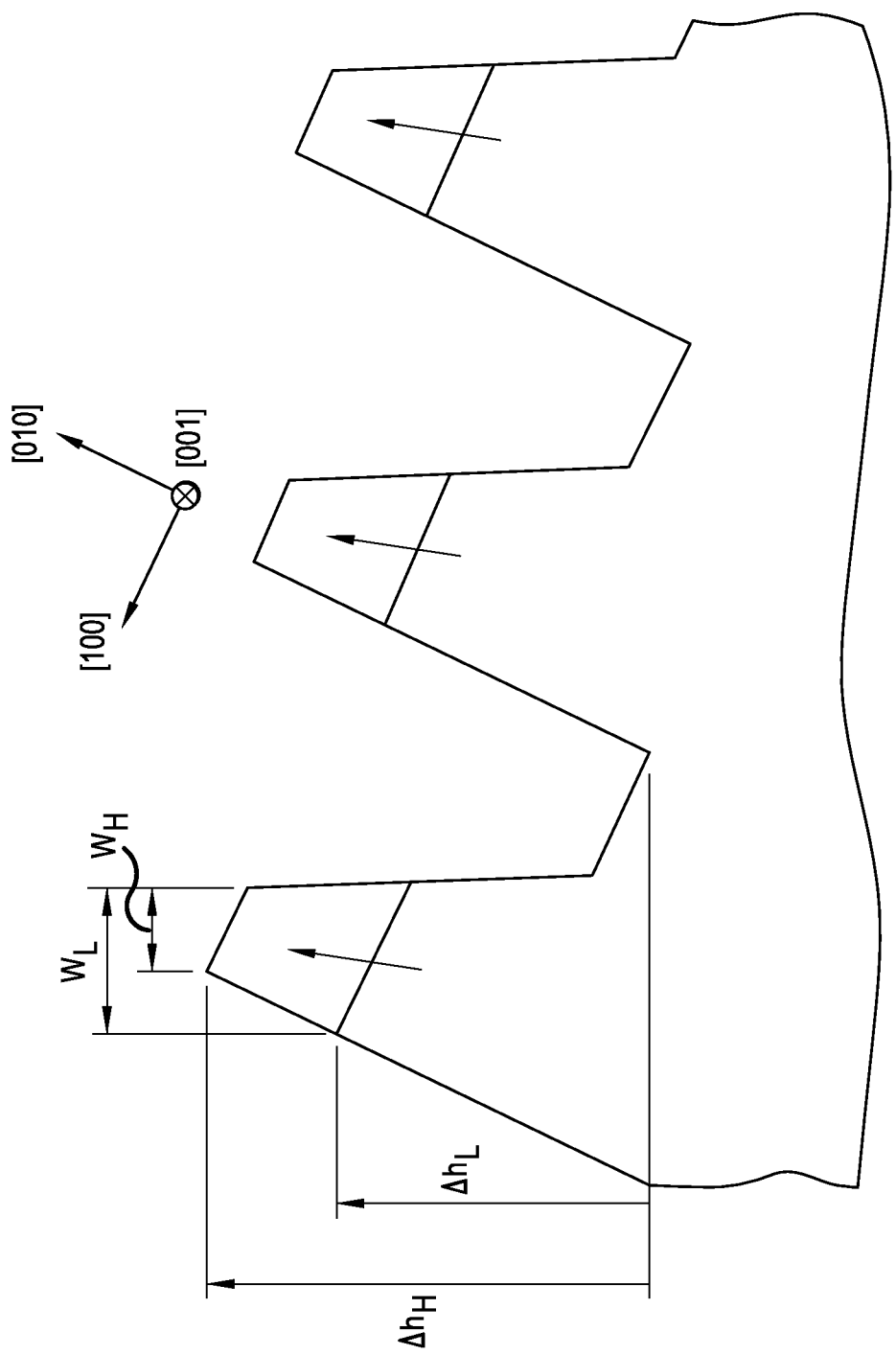
FIG. 8 is a schematic diagram showing how an annealing temperature controls the width of each elongated ridge and a height difference according to an embodiment of the present invention.
Figure 9A:
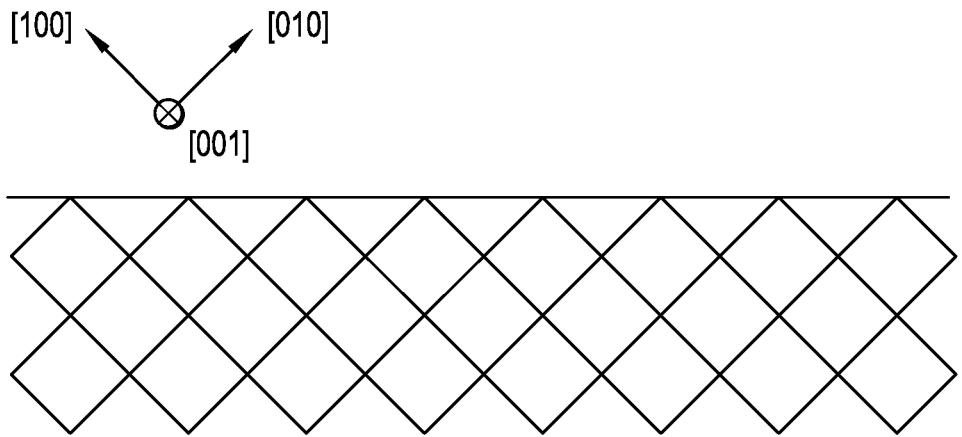
FIG. 9 is a schematic diagram showing a cross-sectional relationship between a crystalline substance having an off-angle of approximately 45 degrees, and a surface thereof, FIG. 9(a) showing the case where the crystalline substance geometrically has an off-angle of exactly 45 degrees, and FIG. 9(b) showing the case where a miscut angle overlaps with the 45-degree off-angle.
Figure 9B:
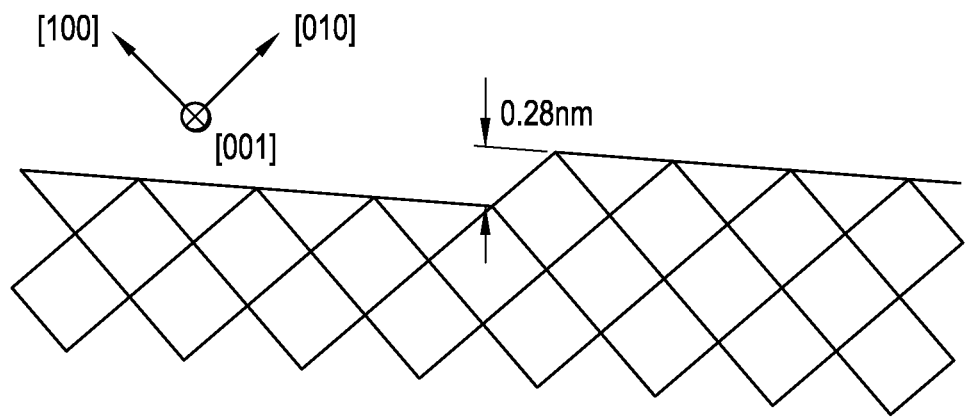

Next, a method for controlling the shapes of the uneven structures in the annealing process (S104 in FIG. 2) is described based on the example. As described in the example above, the width of each elongated ridge and the height difference vary between the uneven structure of the low-temperature sample and the uneven structure of the high-temperature sample of the crystalline substance 1. The actually created high-temperature sample of the crystalline substance 1 was obtained by performing an additional annealing process at high temperature (1180° C.) on the low-temperature sample that had been subjected to an annealing process at low temperature (1100° C.). However, in the annealing process that is performed for a sufficiently long period of time, the shape of the surface 10 depends on the final temperature and does not affect the initial state of the crystalline substance or the polished crystalline substance and the annealed crystalline substance. The difference in the annealing temperature between the low-temperature sample and the high-temperature sample can be used to adjust the width of each elongated ridge and the height difference in each uneven structure. FIG. 8 is a schematic diagram showing how the annealing temperatures control the width of each elongated ridge and the height difference. The annealing temperatures are responsible for the shape that is in thermal equilibrium with the surface 10. Therefore, the width of each elongated ridge and the height difference in each uneven structure can be adjusted by adjusting the annealing temperatures. As shown in FIG. 8, a high annealing temperature increases the height difference of each uneven structure and reduces the width of each elongated ridge. At this moment, the pitch of the ridges and valleys is not changed in the low-temperature sample and the high-temperature sample. Thus, when using a quantum phenomenon generated in the uneven structure of the crystalline substance 1 or when using a quantum phenomenon by forming another nanostructure using the uneven structure of the crystalline substance 1, the height difference of each uneven structure and the width of each elongated ridge therein can be controlled to a desired height difference and a desired width.

[Specific Method of Annealing Process: Method for Controlling the Height Difference in Uneven Structures]

When the height difference between step portions formed along the crystal structure is too large, the accumulated Sr or its oxide SrO can be removed by wet-etching the annealed surface with acid, reducing the height difference between the step portions to a height difference corresponding to one unit cell. In other words, the height difference can be controlled to a desired height difference by repeating several times the step of forming a nanostructure at a low annealing temperature and wet-etching the surface with acid.

[Other Representations of Uneven Structures]

In order to characterize and distinguish the structure of the surface from the conventional step-and-terrace structure, the uneven structures observed in the low-temperature sample and the high-temperature sample can be defined by an expression method different from the one focusing on the orientations of the faces. For instance, the level of each face corresponds to another aspect for characterizing its uneven structure. In other words, the characteristic uneven structure of the present embodiment has the top faces 11L and 11H (referred collectively as "top face 11" hereinafter) and the floor faces 12L and 12H (referred collectively as "face 12" hereinafter), which are the faces in the same orientation out of at least the three orientations. The floor face 12 is positioned between the continuous top faces 11. The floor face 12 is not flush with the top faces 11 on either side and configured to discontinuously lower. Such a representation can define the uneven structure of the present embodiment. The schematic diagrams of FIGS. 5 and 7 describes how the uneven structure having a substantially constant pitch is formed, the uneven structure of the crystalline substance of the present embodiment is not limited to have a constant pitch.

First Embodiment

Modification

The present embodiment can take various modifications. For example, a similar crystalline substance can be provided using a material other than strontium titanate. In relation to the material having the composition $ABO_3$ in the perovskite structure, the results of the examination in the first embodiment can be applied by simply searching for specific conditions.

One of the most effective materials having the composition $ABO_3$ is a cubic perovskite material containing Sr (strontium) as the A atom (referred to as "Sr-based material"). A typical Sr-based material includes each of the substances included in $SrFeO_3$, $SrVO_3$, $SrMnO_3$, and $SrCoO_3$. Note that $SrCrO_3$ is not included therein, because it is difficult to obtain such a state as $Cr^{4+}$. It is only a polycrystalline substance that can be formed into a cubic crystal using $SrMnO_3$. However, in view of the fact that a polycrystalline substance configures a sufficiently practical device depending on the grain size, $SrMnO_3$, too, can be used as a material of a crystalline substance similar to the one described in the first embodiment.

Next, a material other than the Sr-based material that has the composition $ABO_3$ is selected. As with Sr, the material is selected based on the fact that point defects are generated in the material due to an annealing process performed in the atmosphere under appropriate conditions. Such material is typically a cubic perovskite material containing Ti (titanium) as the B atom (referred to as "Ti-based material"). A typical Ti-based material includes the substances included in $CaTiO_3$, $BaTiO_3$, and $PbTiO_3$. Another typical material can be a cubic perovskite material containing K (potassium) as the A atom (referred to as "K-based material"). This K-based material includes each of the substances included in $KNbO_3$ and $KTaO_3$. Note that precipitation of the composition $K_2O$ occurs in the K-based material.

The crystalline substance 1 of the first embodiment can be used as a variety of devices that utilize the configuration unique to the quantum phenomenon caused by the crystalline substance 1 itself.

Second Embodiment

The crystalline substance according to the first embodiment can be used as a substrate. In other words, the crystalline substance 1 of the present embodiment can be used to exhibit the quantum size effect of the shape of the surface or unique crystal structure associated with the uneven structure of the crystalline substance 1 of the first embodiment, onto an additional object formed on the uneven structure. In so doing, there are no special ways to form the additional object; thus, the additional object can be formed, for example, only on the top portions of the elongated ridges or along the uneven structure. The object can also be formed to fill the valleys of the uneven structure to flatten it.

As described above, the crystalline substance, the substrate, and the method for producing the crystalline substance according to each of the embodiments of the present invention can produce an uneven structure capable of using both anisotropy associated with the crystal axis of the corresponding crystalline substance and anisotropy associated with the shape of the same. In so doing, it is not necessary to make any special changes on the conventional step or device for forming the surface. The individual embodiments of the present invention can exhibit the designed functions of the device that utilizes the uneven structure of the crystalline substance. Furthermore, the uneven structure of the crystalline substance according to each of the embodiments is formed long the crystal axis thereof. Thus, the direction in which the uneven structure extends can be determined without depending on how the crystalline substance is cut or on a step of polishing the crystalline substance, and variability among the batches of crystalline substances can be resolved. Specific conditions for performing the annealing process, such as the material, composition, thickness of the crystalline substance illustrated in the present embodiment, as well as a method for forming the crystalline substance, and especially the annealing temperatures, times and environments, are not limited to the ones described in the individual embodiments. The embodiments and the example are described in order to explain the present invention and are not intended to limit the present invention. The scope of the invention of the present application should be defined on the basis of the description of the scope of claims. In addition, modifications within the scope of the present invention including other combinations of the individual embodiments are also included in the scope of claims.

INDUSTRIAL APPLICABILITY

The present invention can be used as a crystalline substance with an uneven structure that brings a new function or high performance to a device, a substrate, and a method for producing the crystalline substance.

EXPLANATION OF REFERENCE NUMERALS

1 Crystalline substance
10L, 10H Surface
11L, 11H Top face
12L, 12H Floor face
12A Virtual face
13L, 13H, 14L, 14H Slope face

The invention claimed is:
1. A crystalline substance, comprising:
a surface that exposes an oxide crystal thereon and extends in a direction of a crystal axis of the oxide crystal,
wherein the surface has an uneven structure that is configured by faces extending in at least three orientations along the crystal axis,
the oxide crystal has a crystal structure of a perovskite structure,
the crystal axis is a [001] axis of the oxide crystal, and the uneven structure expands so as to be substantially parallel to a (210)-plane of the oxide crystal.

2. The crystalline substance according to claim 1, wherein the oxide crystal is strontium titanate ($SrTiO_3$), and
the uneven structure is formed by performing an annealing process on the surface at an end-point temperature of 1100° C. or higher.

3. A method for producing a crystalline substance that has an uneven structure on a surface thereof, the method comprising:
preparing a crystalline substance that has a surface exposing an oxide crystal thereon and extending in a direction of a crystal axis of the oxide crystal; and
forming an uneven structure that is configured by faces extending in at least three orientations along the direction of the crystal axis, by annealing the surface,
wherein the oxide crystal is (210)-plane oriented strontium titanate ($SrTiO_3$), and
the formation of the uneven structure comprises annealing the surface at an end-point temperature of 1100° C. or higher.

* * * * *